(12) United States Patent
Zhang et al.

(10) Patent No.: US 12,131,785 B2
(45) Date of Patent: Oct. 29, 2024

(54) WEAK ERASE PULSE

(71) Applicant: Intel NDTM US LLC, Santa Clara, CA (US)

(72) Inventors: Chao Zhang, Milpitas, CA (US); Krishna Parat, Palo Alto, CA (US); Richard Fastow, Cupertino, CA (US); Ricardo Basco, Santa Clara, CA (US); Xin Sun, Fremont, CA (US); Heonwook Kim, Santa Clara, CA (US); Zhan Liu, Santa Clara, CA (US)

(73) Assignee: Intel NDTM US LLC, Santa Clara, CA (US)

( * ) Notice: Subject to any disclaimer, the term of this patent is extended or adjusted under 35 U.S.C. 154(b) by 151 days.

(21) Appl. No.: 17/829,837

(22) Filed: Jun. 1, 2022

(65) Prior Publication Data

US 2022/0293189 A1 Sep. 15, 2022

(51) Int. Cl.
*G11C 16/08* (2006.01)
*G11C 7/04* (2006.01)
*G11C 16/16* (2006.01)
*G11C 16/24* (2006.01)
*G11C 16/26* (2006.01)
*G11C 16/34* (2006.01)

(52) U.S. Cl.
CPC ........... *G11C 16/16* (2013.01); *G11C 7/04* (2013.01); *G11C 16/08* (2013.01); *G11C 16/24* (2013.01); *G11C 16/26* (2013.01); *G11C 16/349* (2013.01)

(58) Field of Classification Search
CPC ........... G11C 16/16; G11C 7/04; G11C 16/08; G11C 16/24; G11C 16/26; G11C 16/349

USPC ................................................. 365/185.29
See application file for complete search history.

(56) References Cited

U.S. PATENT DOCUMENTS

| | | | |
|---|---|---|---|
| 2018/0203642 A1* | 7/2018 | Sharma | G11C 11/5628 |
| 2021/0280260 A1* | 9/2021 | Shiino | G11C 16/344 |
| 2022/0028459 A1 | 1/2022 | Cao et al. | |
| 2023/0207018 A1* | 6/2023 | Ning | G11C 16/3459 |
| | | | 365/189.011 |

FOREIGN PATENT DOCUMENTS

| | | | | |
|---|---|---|---|---|
| JP | 2011014817 A | * | 1/2011 | G11C 16/04 |
| TW | 201628006 A | * | 8/2016 | |

OTHER PUBLICATIONS

U.S. Appl. No. 17/732,117 entitled "Power Efficent Array Discharge for Program Boosting," filed Apr. 28, 2022, 30 pages.

* cited by examiner

*Primary Examiner* — Ly D Pham
(74) *Attorney, Agent, or Firm* — Jordan IP Law, LLC

(57) ABSTRACT

Systems, apparatuses and methods may provide for technology that biases a word line of a block in NAND memory to a first voltage level, biases a source-side select gate and a drain-side select gate of the block to a second voltage level, and issues a discharge erase pulse to bitlines and a source of the block, wherein the discharge erase pulse is issued at a third voltage level, wherein the third voltage level is greater than the first voltage level and the second voltage level, and wherein the third voltage level is less than a fourth voltage level of a standard erase pulse. In one example, the discharge erase pulse injects holes into pillars of the block and bypasses an erase of cells in the pillars of the block.

20 Claims, 4 Drawing Sheets

WEAK ERASE PULSE

TECHNICAL FIELD

Embodiments generally relate to memory structures. More particularly, embodiments relate to the use of weak erase pulses to improve reliability in memory structures.

BACKGROUND

In three-dimensional (3D) NAND memory arrays, pillars are connected to a source and a drain through a source-side select gate (SGS) and a drain-side select gate (SGD), respectively. Very often after array discharge, the pillars may be "floated" with excess electrons trapped in the pillars, causing a potential difference between the pillars and local word lines (LWLs) connected to the pillars. This potential difference (e.g., pillar "boosting") is typically detrimental to data retention because it prevents shallowly trapped electrons from escaping (e.g., "detrapping"). Conventional approaches to releasing the pillar boosting stress may increase latency and/or power consumption.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

In recent years, vertical memory, such as three-dimensional (3D) memory has been developed. A 3D flash memory (e.g., 3D NAND memory array) device may include a plurality of strings of charge storage devices (memory cells) stacked over one another (e.g., in a first of three dimensions of 3D) with each charge storage device corresponding to one of multiple tiers of the device. The charge storage devices of a respective string may share a common channel region, such as one formed in a respective pillar of semiconductor material (e.g., polysilicon) about which the string of charge storage devices may be formed.

In a second dimension, each first group of the plurality of strings may comprise, for example, a group of strings sharing a plurality of access lines, known as word lines (WLs). Each of the plurality of access lines may couple (e.g., electrically or otherwise operably connect) the charge storage devices (memory cells) corresponding to a respective tier of the plurality of tiers of each string. The charge storage devices coupled by the same access line (and thus corresponding to the same tier) may be logically grouped into memory pages, where each charge storage device includes a multi-level cell capable of storing two or more bits of information. In a third dimension, each group of the plurality of strings may include a group of strings coupled by corresponding data lines, known as bit lines (BLs).

Figure 1:
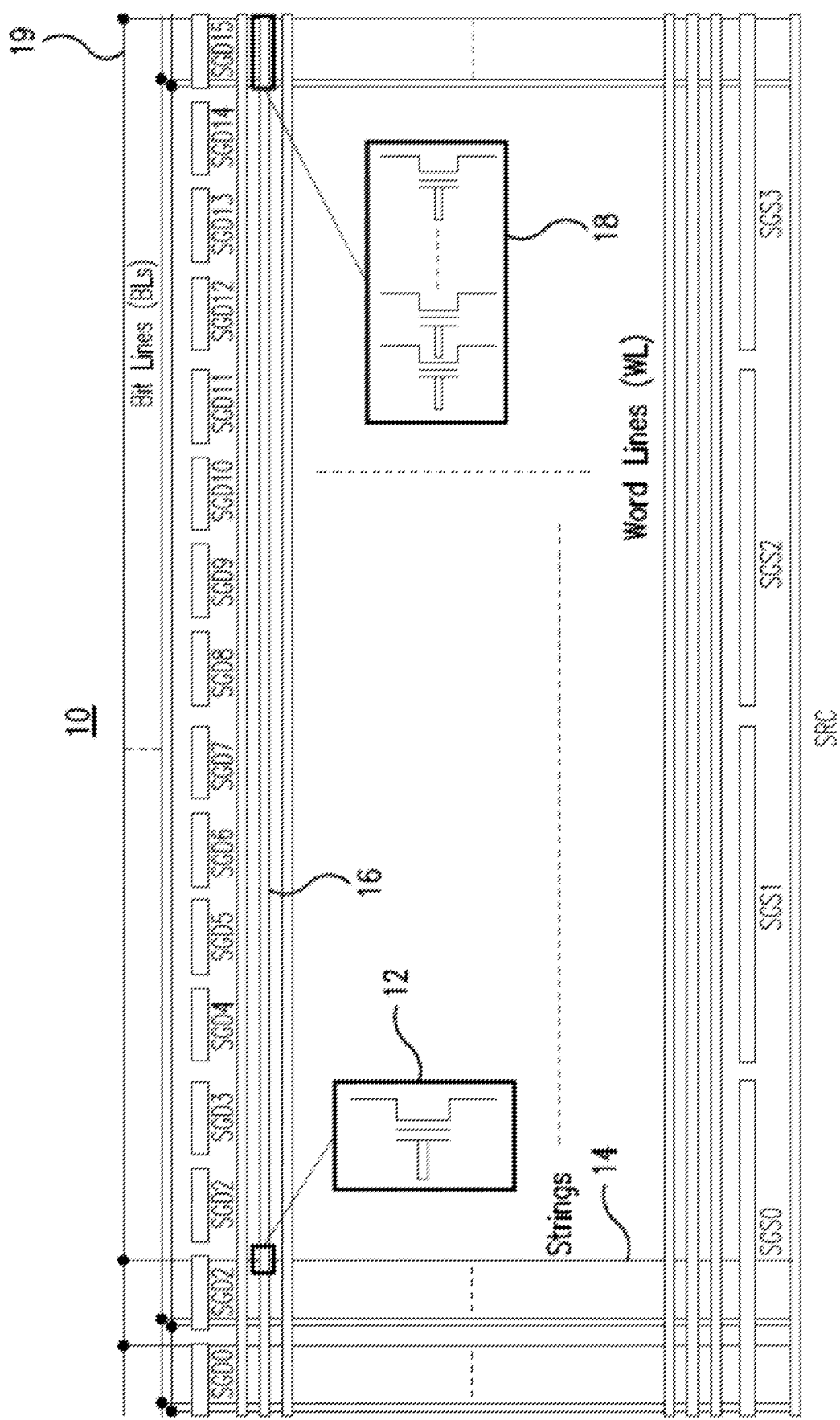
FIG. 1 is a schematic diagram of an example of a NAND memory array according to an embodiment.

Turning now to FIG. 1, a 3D NAND memory array 10 is shown in which a group of cells 12 (e.g., floating gates, charge traps) are accessible through various control signals to perform basic memory operations. In general, each cell 12 is located at the intersection of a string such as, for example, a string 14 and a word line such as, for example, a WL 16. A page 18 is the programmable unit of the array 10 and is accessible within a block by selecting a word line, a drain-side select gate (SGD, e.g., "SGD15"), and a source-side select gate (SGS, e.g., "SGS3"). Bit lines such as, for example, a bit line 19, may be used to address the individual strings or cells inside the page 18.

Each cell 12 can store a few binary bits (n) and therefore has the capability to be programmed to $2^n$ levels (e.g., four bits per cell is programmed to sixteen distinguishable levels). For example, programing the desired different levels of various the cells in the page 18 involves issuing a series of programing pulses that are applied to the selected ("Sel") word line to inject electrons in the charge storage (e.g., trap/floating gate, etc.). Each pulse is followed by a series of verify operations ("verifies"), which in principle are read operations to detect whether each cell has reached the targeted programming level. Once a cell has passed the verify of the targeted level, the bit line is used to inhibit any additional programming of the cell by shutting down the bit line-to-select gate junction. In addition to cells passing verify on the selected sub block, all cells on unselected ("Unsel") subblocks (e.g., controlled by different SGDs) are inhibited.

After discharge of the array 10, the pillars may be "floated" with excess electrons trapped in the pillars, causing a potential difference between the pillars and local word lines (LWLs) connected to the pillars. Unless a LWL-pillar capacitor is discharged from both sides, this pillar boosting may be detrimental to data retention because shallowly trapped electrons are prevented from detrapping.

More particularly, when the array 10 is discharged, all WLs and the SGS/SGD devices are initially biased with a pass voltage ($V_{pass}$) and then ramp down to zero volts (V), while SRC and BL stay at ground (GND). At the end of the discharge, excess electrons are trapped in the pillars by high threshold voltage ($V_T$) cells, and a potential difference is built across the tunnel oxide—local WLs are grounded and the pillars are at a negative potential. In the presence of this pillar boosting field, shallowly trapped electrons generated during cycling cannot detrap. Moreover, these electrons can accumulate over cycles. Once the pillar boosting is released (e.g., during data retention "bake" or a power loss), these electrons detrap, causing a relatively large $V_T$ downshift and read window budget (RWB) loss.

Technology described herein provides an approach to releasing the pillar boosting stress without increasing latency or power consumption. As a result, the reliability and/or performance of the array 10 is enhanced. For example, a "weak" erase pulse (WEP) may be used to discharge the pillars and release the pillar boosting stress. In the WEP, the SRC and BL are biased at a relatively high voltage while the SGS/SGD devices and WLs are biased at lower voltages to provide an "underdrive". Holes are introduced into the pillars by gate induced drain leakage (GIDL) current generated at the SGD/SGS devices. The biases and WEP pulse width can be used to control the GIDL current and the degree of discharge.

WEPs can be issued during 3D NAND operations either regularly or randomly. Moreover, the voltage, duration, and frequency of WEP can be adjusted based on temperature, workload, deck status (e.g., where programming may begin at a center of the pillar and progress upwards to the drain/top deck or downward to the source/bottom deck) and block wearing. In embodiments, the WEP is applied to a single block or multiple blocks in a sequential or parallel/synchronized manner.

Figure 2:
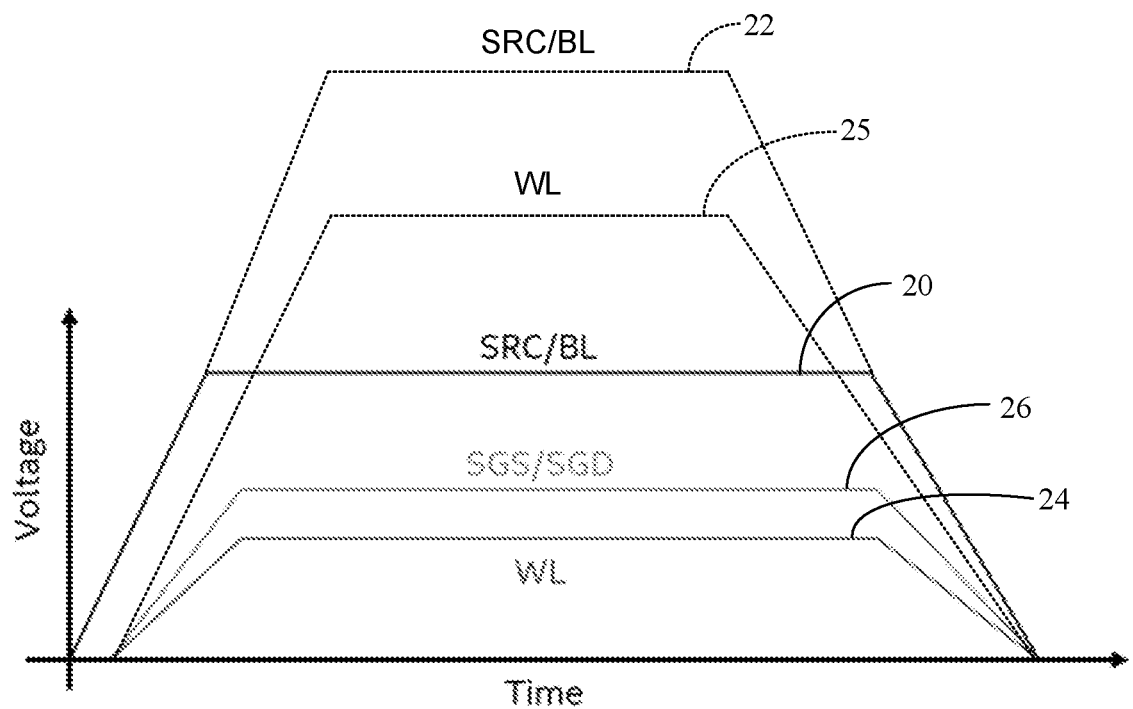
FIG. 2 is a plot of an example of a weak erase pulse according to an embodiment.

Turning now to FIG. 2, a discharge erase pulse 20 (e.g., WEP) is designed as a short erase pulse with an SRC/BL voltage that is substantially lower than the SRC/BL voltage of a standard erase pulse 22. Concurrently, a relatively low SGD/SGS/WL underdrive is achieved by biasing a WL voltage 24 and an SGS/SGD voltage 26 to levels that are less than the voltage level of the discharge erase pulse 20. Pre-program and erase verify operations may also be removed from the discharge erase pulse 20, which is issued to the target block to discharge the pillars.

In an embodiment, the WL voltage 24 is less than a voltage level 25 of an unselected word line bias associated with the standard erase pulse. More particularly, for the standard erase pulse, there can be selected (SEL) WLs (e.g., WLs that are to be erased) and unselected (UNSEL) WLs (e.g., WLs that are not to be erased) in the same block. SEL WLs are biased at relatively low voltage level 27 (e.g., close to 0V), so that the underdrive is large enough to erase the cells. UNSEL WLs receive much less of an underdrive at the voltage level 25 so as not erase the cells, but still allow hole passing. For the WEP, WLs may be similar to UNSEL WLs in the regular erase pulse—an underdrive is provided to pass holes, but not to erase the cells. Since the SRC/BL voltage of the discharge erase pulse 20 is lower, the WL voltage 24 of the WEP is also usually lower than the voltage level 25 of UNSEL WLs in the regular erase pulse. The underdrive, however, may be comparable.

The discharge erase pulse 20 discharges the pillars with GIDL current while the LWLs are biased to provide an underdrive, facilitating hole transport deep into the pillars. The illustrated approach is much more efficient compared with "all-WL ground" solutions, which hold all LWL/BL/SRC/SGS/SGD components at ground for a certain period, and "other block erase" solutions, which erase other (e.g., un-selected) blocks in the array in an attempt to induce weak GIDL current in the unselected blocks. The intensity of GIDL current in the illustrated solution can be controlled by tuning the SRC/BL bias, SGS/SGD/WL underdrive, and WEP pulse width. Moreover, the WEP can be issued regularly to discharge the pillars, release the BICL stress, and improve the data retention of the product.

Figure 3:
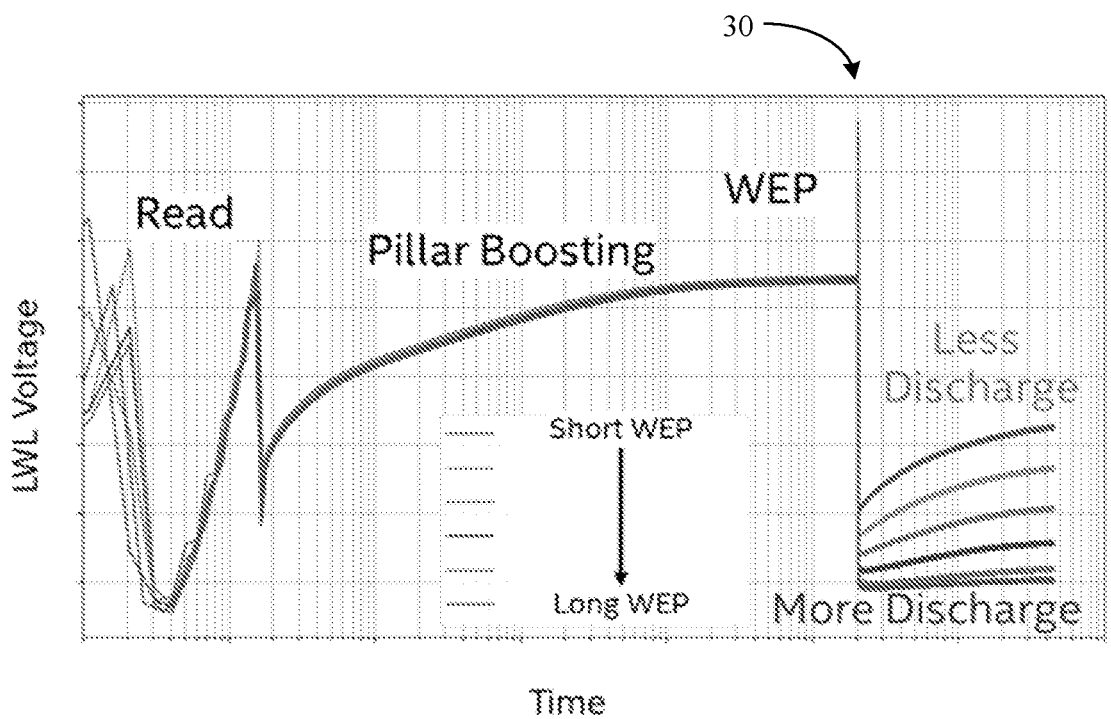
FIG. 3 is a plot of an example of local word line voltage curves according to an embodiment.

FIG. 3 shows a discharge erase pulse 30 that is issued after pillar boosting. In the illustrated example, the duration of the discharge erase pulse 30 is set (e.g., based on temperature, workload, deck status and/or wear state associated with the block) to control the amount of discharge from the pillars and LWLs. Thus, a shorter duration results in less discharge than a longer duration.

Additionally, post-cycling high temperature data retention (HTDR) RWB loss can be improved by inserting the discharge erase pulse 30 during cycling. Keeping the pillars boosted during cycling by frequent read results in large RWB loss in HTDR. Keeping the block idle between cycles leaves the pillars in a stable state and results in very small RWB loss in HTDR. Thus, inserting the discharge erase pulse 30 between cycles can discharge the pillars and improve the HTDR RWB loss. Providing the discharge erase pulse 30 with a higher WL underdrive can also discharge the pillars more effectively and therefore improve RWB loss even further.

Figure 4:
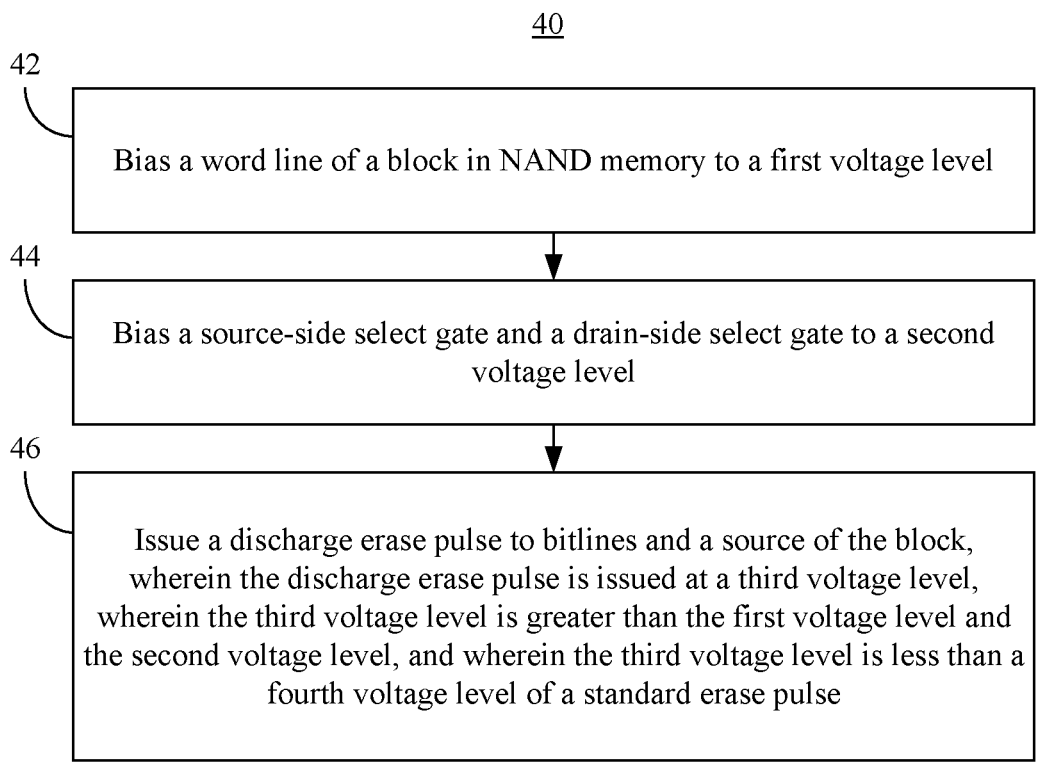
FIG. 4 is a flowchart of an example of a method of operating a memory chip controller according to an embodiment.

FIG. 4 shows a method 40 of operating a memory chip controller. The method 40 may be implemented in one or more modules as a set of logic instructions stored in a machine- or computer-readable storage medium such as random access memory (RAM), read only memory (ROM), programmable ROM (PROM), firmware, flash memory, etc., in hardware, or any combination thereof. For example, hardware implementations may include configurable logic, fixed-functionality logic, or any combination thereof. Examples of configurable logic include suitably configured programmable logic arrays (PLAs), field programmable gate arrays (FPGAs), complex programmable logic devices (CPLDs), and general purpose microprocessors. Examples of fixed-functionality logic include suitably configured application specific integrated circuits (ASICs), combinational logic circuits, and sequential logic circuits. The configurable or fixed-functionality logic can be implemented with complementary metal oxide semiconductor (CMOS) logic circuits, transistor-transistor logic (TTL) logic circuits, or other circuits.

Illustrated processing block 42 provides for biasing a word line (WL) of a block in NAND memory to a first voltage, wherein processing block 44 biases a source-side select gate (SGS) and a drain-side select gate (SGD) to a second voltage level. Processing block 46 issues a discharge erase pulse (e.g., WEP) to bit lines (BLs) and a source (SRC) of the block while the WL, SGS and SGD are biased. In the illustrated example, the discharge erase pulse is issued at a third voltage level, which is greater than the first voltage level and the second voltage level. Additionally, the third voltage level is less than a fourth voltage level of a standard erase pulse and the first voltage level may be less than a fifth voltage level of an unselected word line bias associated with the standard erase pulse.

In an embodiment, the discharge erase pulse injects holes into pillars of the block and bypasses an erase of cells (e.g., maintaining cell content) in the pillars of the block. Moreover, the discharge erase pulse may discharge the pillars of the block with gate induced drain leakage (GIDL) current. In one example, processing block 46 sets the duration of the discharge erase pulse, the frequency of the discharge erase pulse and/or the third voltage level based on one or more of a temperature, a workload, a deck status or a wear state associated with the block. Moreover, processing block 46 may issue the discharge erase pulse to bit lines and sources of a plurality of blocks in the NAND memory. The method 40 therefore enhances performance at least to the extent that underdriving the relatively weak discharge erase pulse discharges the LWL-pillar capacitor from both sides, releases pillar boosting stress and/or improves the reliability of the NAND memory.

Figure 5:
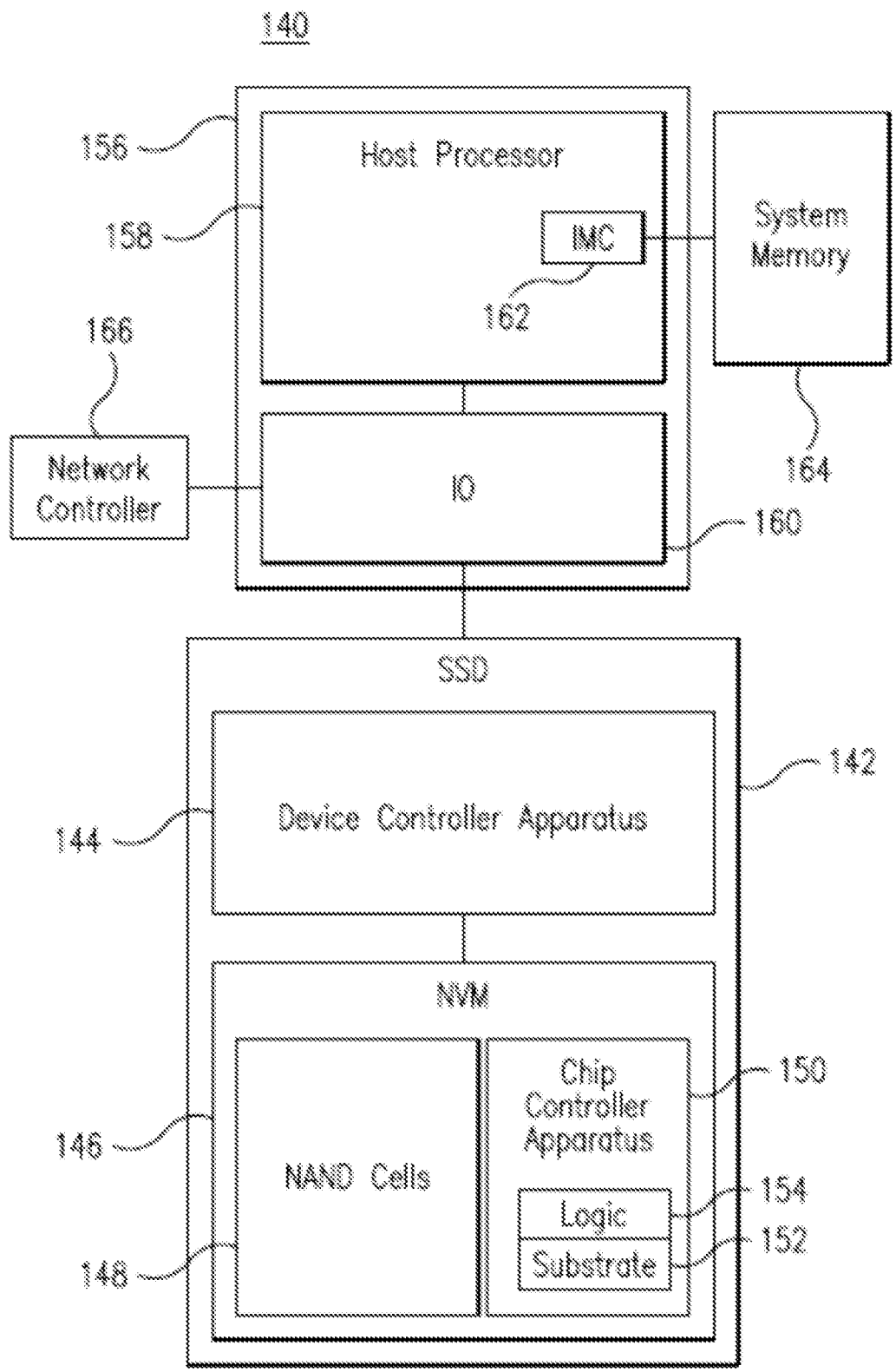
FIG. 5 is a block diagram of an example of a performance-enhanced computing system according to an embodiment.

Turning now to FIG. 5, a performance-enhanced computing system 140 is shown. In the illustrated example, a solid state drive (SSD) 142 includes a device controller apparatus 144 that is coupled to a non-volatile memory (NVM) 146. The illustrated NVM 146 includes a set of NAND cells 148 (e.g., NAND memory array) and a memory chip controller apparatus 150 coupled to the NAND cells 148, wherein the chip controller apparatus 150 includes one or more substrates 152 (e.g., silicon, sapphire, gallium arsenide) and logic 154 (e.g., transistor array and other integrated circuit/IC components) coupled to the substrate(s) 152. The logic 154, which may include one or more of configurable or fixed-functionality hardware, may be configured to perform one or more aspects of the method 40 (FIG. 4), already discussed.

More particularly, the logic 154 may bias a word line in the NAND cells 148 to a first voltage level, bias an SGS and an SGD of the block to a second level, and issue a discharge erase pulse (e.g., WEP) to BLs and an SRC of the block. As already noted, the discharge erase pulse is issued at a third voltage level and the third voltage level is greater than the first voltage level and the second voltage level. The memory chip controller apparatus 150 is therefore considered performance-enhanced at least to the extent that underdriving the relatively weak discharge erase pulse discharges the LWL-pillar capacitor from both sides, releases pillar boosting stress and/or improves the reliability of the NAND cells 148.

The illustrated system 140 also includes a system on chip (SoC) 156 having a host processor 158 (e.g., central processing unit/CPU) and an input/output (IO) module 160. The host processor 158 may include an integrated memory controller 162 (IMC) that communicates with system memory 164 (e.g., RAM dual inline memory modules/DIMMs). The illustrated IO module 160 is coupled to the SSD 142 as well as other system components such as a network controller 166.

In one example, the logic 154 includes transistor channel regions that are positioned (e.g., embedded) within the substrate(s) 152. Thus, the interface between the logic 154 and the substrate(s) 152 may not be an abrupt junction. The logic 154 may also be considered to include an epitaxial layer that is grown on an initial wafer of the substrate(s) 152.

ADDITIONAL NOTES AND EXAMPLES

Example 1 includes a performance-enhanced memory chip controller comprising one or more substrates and logic coupled to the one or more substrates, wherein the logic is implemented at least partly in one or more of configurable or fixed-functionality hardware, the logic to bias a word line of a block in NAND memory to a first voltage level, bias a source-side select gate and a drain-side select gate of the block to a second voltage level, and issue a discharge erase pulse to bitlines and a source of the block, wherein the discharge erase pulse is issued at a third voltage level, wherein the third voltage level is greater than the first voltage level and the second voltage level, and wherein the third voltage level is less than a fourth voltage level of a standard erase pulse.

Example 2 includes the memory chip controller of Example 1, wherein the discharge erase pulse injects holes into pillars of the block and bypasses an erase of cells in the pillars of the block.

Example 3 includes the memory chip controller of Example 1, wherein the first voltage level is less than a fifth voltage level of an unselected word line bias associated with the standard erase pulse.

Example 4 includes the memory chip controller of Example 1, wherein the logic is to set a duration of the discharge erase pulse based on one or more of a temperature, a workload, a deck status or a wear state associated with the block.

Example 5 includes the memory chip controller of Example 1, wherein the logic is to set a frequency of the discharge erase pulse based on one or more of a temperature, a workload, a deck status or a wear state associated with the block.

Example 6 includes the memory chip controller of Example 1, wherein the logic is to set the first voltage level, the second voltage level, and the third voltage level based on one or more of a temperature, a workload, a deck status or a wear state associated with the block.

Example 7 includes the memory chip controller of any one of Examples 1 to 6, wherein the logic is to issue the discharge erase pulse to bitlines and sources of a plurality of blocks in the NAND memory.

Example 8 includes a computing system comprising a NAND memory, and a memory chip controller coupled to the NAND memory, wherein the memory chip controller includes logic coupled to one or more substrates, the logic to bias a word line of a block in the NAND memory to a first voltage level, bias a source-side select gate and a drain-side select gate of the block to a second voltage level, and issue a discharge erase pulse to bitlines and a source of the block, wherein the discharge erase pulse is issued at a third voltage level, wherein the third voltage level is greater than the first voltage level and the second voltage level, and wherein the third voltage level is less than a fourth voltage level of a standard erase pulse.

Example 9 includes the computing system of Example 8, wherein the discharge erase pulse injects holes into pillars of the block and bypasses an erase of cells in the pillars of the block.

Example 10 includes the computing system of Example 8, wherein the first voltage level is less than a fifth voltage level of an unselected word line bias associated with the standard erase pulse.

Example 11 includes the computing system of Example 8, wherein the logic is to set a duration of the discharge erase pulse based on one or more of a temperature, a workload, a deck status or a wear state associated with the block.

Example 12 includes the computing system of Example 8, wherein the logic is to set a frequency of the discharge erase pulse based on one or more of a temperature, a workload, a deck status or a wear state associated with the block.

Example 13 includes the computing system of Example 8, wherein the logic is to set the first voltage level, the second voltage level, and the third voltage level based on one or more of a temperature, a workload, a deck status or a wear state associated with the block.

Example 14 includes the computing system of any one of Examples 8 to 13, wherein the logic is to issue the discharge erase pulse to bitlines and sources of a plurality of blocks in the NAND memory.

Example 15 includes a method of operating a performance-enhanced memory chip controller, the method comprising biasing a word line of a block in NAND memory to a first voltage level, biasing a source-side select gate and a drain-side select gate of the block to a second voltage level, and issuing a discharge erase pulse to bitlines and a source of the block, wherein the discharge erase pulse is issued at a third voltage level, wherein the third voltage level is greater than the first voltage level and the second voltage level, and wherein the third voltage level is less than a fourth voltage level of a standard erase pulse.

Example 16 includes the method of Example 15, wherein the discharge erase pulse injects holes into pillars of the block and bypasses an erase of cells in the pillars of the block.

Example 17 includes the method of Example 15, wherein the first voltage level is less than a fifth voltage level of an unselected word line bias associated with the standard erase pulse.

Example 18 includes the method of any one of Examples 15 to 17, further including setting a duration of the discharge erase pulse based on one or more of a temperature, a workload, a deck status or a wear state associated with the block.

Example 19 includes the method of any one of Examples 15 to 18, further including setting a frequency of the discharge erase pulse based on one or more of a temperature, a workload, a deck status or a wear state associated with the block.

Example 20 includes the method of any one of Examples 15 to 19, set the first voltage level, the second voltage level, and the third voltage level based on one or more of a temperature, a workload, a deck status or a wear state associated with the block.

Example 21 includes an apparatus comprising means for performing the method of any one of Examples 15 to 20.

Technology described herein is therefore faster than all-WL ground solutions because the technology does not rely on the leakage current when the SGD/SGS and string drivers are all off. The technology described herein is also faster and more reliable than other block erase solutions because GIDL current generated on unselected target blocks when erasing other blocks is not weak. Also, the technology described herein provides a stronger driving force to transport holes deep into the pillars. The WLs farther away from SGS/SGD are also easier to discharge.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A; B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A memory chip controller comprising:
one or more substrates, and
logic coupled to the one or more substrates, wherein the logic is implemented at least partly in one or more of configurable or fixed-functionality hardware, the logic to:
bias a word line of a block in NAND memory to a first voltage level,
bias a source-side select gate and a drain-side select gate of the block to a second voltage level, and
issue a discharge erase pulse to bitlines and a source of the block, wherein the discharge erase pulse is issued at a third voltage level, wherein the third voltage level is greater than the first voltage level and the second voltage level, and wherein the third voltage level is less than a fourth voltage level of a standard erase pulse.

2. The memory chip controller of claim 1, wherein the discharge erase pulse injects holes into pillars of the block and bypasses an erase of cells in the pillars of the block.

3. The memory chip controller of claim 1, wherein the first voltage level is less than a fifth voltage level of an unselected word line bias associated with the standard erase pulse.

4. The memory chip controller of claim 1, wherein the logic is to set a duration of the discharge erase pulse based on one or more of a temperature, a workload, a deck status or a wear state associated with the block.

5. The memory chip controller of claim 1, wherein the logic is to set a frequency of the discharge erase pulse based on one or more of a temperature, a workload, a deck status or a wear state associated with the block.

6. The memory chip controller of claim 1, wherein the logic is to set the first voltage level, the second voltage level, and the third voltage level based on one or more of a temperature, a workload, a deck status or a wear state associated with the block.

7. The memory chip controller of claim 1, wherein the logic is to issue the discharge erase pulse to bitlines and sources of a plurality of blocks in the NAND memory.

8. A computing system comprising:
a NAND memory, and
a memory chip controller coupled to the NAND memory, wherein the memory chip controller includes logic coupled to one or more substrates, the logic to:

bias a word line of a block in the NAND memory to a first voltage level, bias a source-side select gate and a drain-side select gate of the block to a second voltage level, and issue a discharge erase pulse to bitlines and a source of the block, wherein the discharge erase pulse is issued at a third voltage level, wherein the third voltage level is greater than the first voltage level and the second voltage level, and wherein the third voltage level is less than a fourth voltage level of a standard erase pulse.

9. The computing system of claim 8, wherein the discharge erase pulse injects holes into pillars of the block and bypasses an erase of cells in the pillars of the block.

10. The computing system of claim 8, wherein the first voltage level is less than a fifth voltage level of an unselected word line bias associated with the standard erase pulse.

11. The computing system of claim 8, wherein the logic is to set a duration of the discharge erase pulse based on one or more of a temperature, a workload, a deck status or a wear state associated with the block.

12. The computing system of claim 8, wherein the logic is to set a frequency of the discharge erase pulse based on one or more of a temperature, a workload, a deck status or a wear state associated with the block.

13. The computing system of claim 8, wherein the logic is to set the first voltage level, the second voltage level, and the third voltage level based on one or more of a temperature, a workload, a deck status or a wear state associated with the block.

14. The computing system of claim 8, wherein the logic is to issue the discharge erase pulse to bitlines and sources of a plurality of blocks in the NAND memory.

15. A method comprising:

biasing a word line of a block in NAND memory to a first voltage level, biasing a source-side select gate and a drain-side select gate of the block to a second voltage level, and issuing a discharge erase pulse to bitlines and a source of the block, wherein the discharge erase pulse is issued at a third voltage level, wherein the third voltage level is greater than the first voltage level and the second voltage level, and wherein the third voltage level is less than a fourth voltage level of a standard erase pulse.

16. The method of claim 15, wherein the discharge erase pulse injects holes into pillars of the block and bypasses an erase of cells in the pillars of the block.

17. The method of claim 15, wherein the first voltage level is less than a fifth voltage level of an unselected word line bias associated with the standard erase pulse.

18. The method of claim 15, further including setting a duration of the discharge erase pulse based on one or more of a temperature, a workload, a deck status or a wear state associated with the block.

19. The method of claim 15, further including setting a frequency of the discharge erase pulse based on one or more of a temperature, a workload, a deck status or a wear state associated with the block.

20. The method of claim 15, set the first voltage level, the second voltage level, and the third voltage level based on one or more of a temperature, a workload, a deck status or a wear state associated with the block.

* * * * *